(12) United States Patent
Hsieh

(10) Patent No.: US 6,948,240 B2
(45) Date of Patent: Sep. 27, 2005

(54) METHOD FOR SHAPING AN OBJECT

(75) Inventor: Yung-Tsun Hsieh, Changhua (TW)

(73) Assignee: Benq Corporation, Taoyuan (TW)

( * ) Notice: Subject to any disclaimer, the term of this patent is extended or adjusted under 35 U.S.C. 154(b) by 0 days.

(21) Appl. No.: 10/256,842

(22) Filed: Sep. 27, 2002

(65) Prior Publication Data
US 2003/0066678 A1 Apr. 10, 2003

(30) Foreign Application Priority Data
Oct. 5, 2001 (TW) .......................... 90124645 A

(51) Int. Cl.$^7$ ............................................. H01R 43/04
(52) U.S. Cl. ........................... 29/864; 29/825; 174/254; 174/255; 174/72 A
(58) Field of Search .................. 29/825, 864; 174/254, 174/255, 72 A

(56) References Cited

U.S. PATENT DOCUMENTS 4,217,157 A * 8/1980 Stoltze et al. ............... 156/87
5,250,758 A * 10/1993 Fjelstad et al. .............. 174/254
5,424,121 A 6/1995 Murakami ................... 428/337
5,918,365 A * 7/1999 Uchida et al. ................ 29/868
6,643,918 B2 * 11/2003 Ortiz et al. .................... 29/825

FOREIGN PATENT DOCUMENTS

CN 1240376 A 1/2000
JP 11-203949 7/1999

* cited by examiner

Primary Examiner—Rick Kiltae Chang
(74) Attorney, Agent, or Firm—Ladas & Parry LLP

(57) ABSTRACT

A method for shaping an object. The method includes the steps of preparing an attachment material having a glass transition temperature lower than that of the object, fixing the attachment material on the object, forming the object into a predetermined shape, heating the attachment material until the temperature is higher than its glass transition temperature, and cooling the attachment material and the object until the temperature is lower than the glass transition temperature of the attachment material. Additionally, shaping of the object and heating of the attachment material can achieve the same results.

9 Claims, 4 Drawing Sheets

METHOD FOR SHAPING AN OBJECT

BACKGROUND OF THE INVENTION

1. Field of the Invention

The present invention relates to a method for shaping an object, and in particular to a method for shaping a flexible printed cable, so that the flexible printed cable can easily fit in a pivot-rotating mechanism.

2. Description of the Related Art

Generally, the conventional electronic device having a pivot-rotating mechanism, such as a cellular phone having a cover or a digital camera having a rotary lens and movable flash lamp, includes a main body and a rotary body. The signal is transmitted via a flexible printed cable (FPC) passing through the pivot-rotating mechanism between the main body and the rotary body. Nevertheless, because of the frequent movement between the main body and the rotary body, the flexible printed cable is frequently stretched such that the lifespan thereof is reduced.

Thus, there are two conventional methods to overcome the aforementioned problems. In the first method, the length of the flexible printed cable in the pivot-rotating mechanism is longer such that the flexible printed cable is subjected to reduce tensile stress. In the second method, the flexible printed cable in the pivot-rotating mechanism is wound directly or around a shaft.

Nevertheless, the current volume of electronic device is increasingly reduced. The size of the pivot-rotating mechanism is reduced as well. Additionally, the current electronic devices provide more and more functions so that the width of the flexible printed cable increases commensurately. Thus, in order not to increase the width of the flexible printed cable, multiple layers of the flexible printed cable are required and fit into the volume-reduced pivot-rotating mechanism. In the first conventional method, the manufacturing cost of the flexible printed cable is increased and the anti-torsion capability of the flexible printed cable is reduced.

In the second conventional method, the width of the flexible printed cable can exceed the width of the multiple layers of the flexible printed cable. Nevertheless, because the flexible printed cable has elasticity, it is inconvenient to wind the flexible printed cable directly or around a shaft.

Consequently, the invention provides a method to improve the aforementioned second conventional method. It is easier to fit the flexible printed cable in the rotating mechanism by the method of the invention.

SUMMARY OF THE INVENTION

An object of the invention is to provide a method for shaping an object. The method comprises the steps of: (a) preparing an attachment material having a glass transition temperature lower than that of the object; (b) fixing the attachment material on the object; (c) forming the object into a predetermined shape; (d) heating the attachment material until the temperature is higher than its glass transition temperature; and (e) cooling the attachment material and the object until the temperature is lower than the glass transition temperature of the attachment material.

Additionally, the steps (c) and (d) can be exchanged to have the same function.

A detailed description will be given by the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
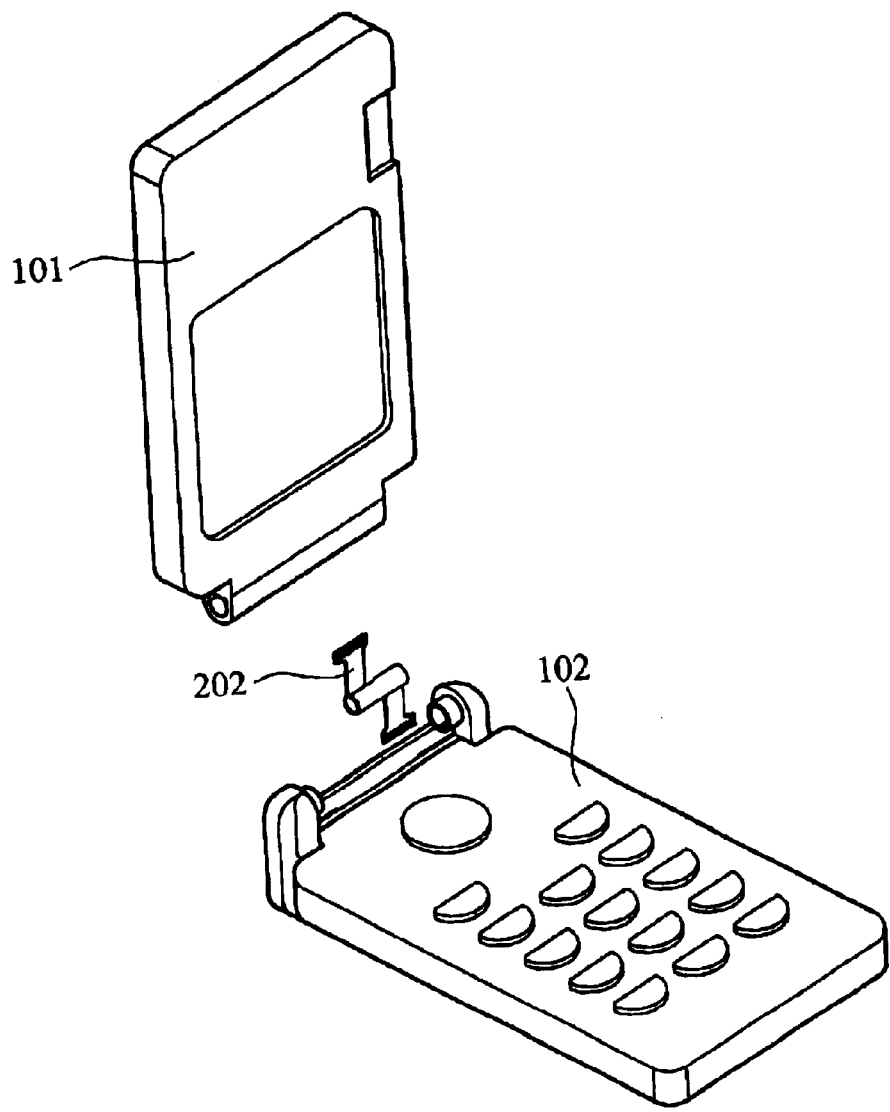
FIG. 1 is a perspective exploded view showing the cellular phone of the invention.
Figure 2:
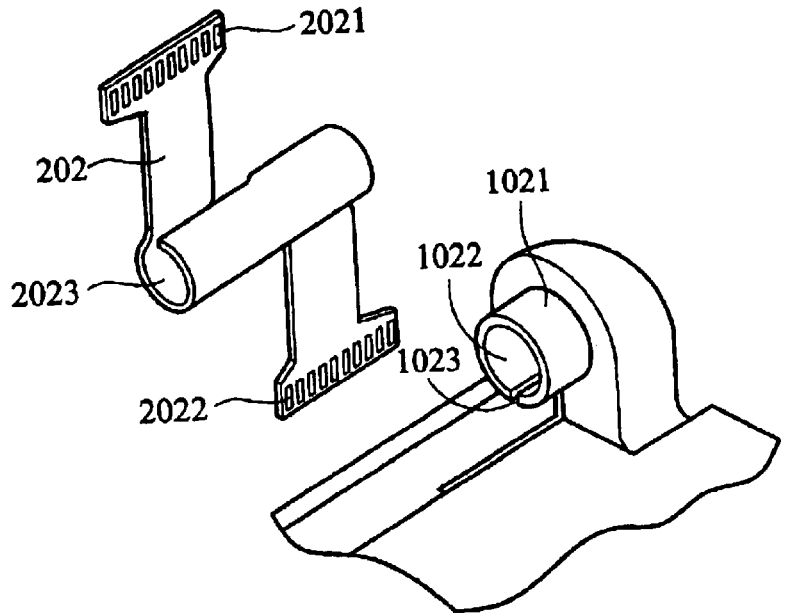
FIG. 2 is a partially enlarged view according to FIG. 1.

Referring to FIG. 1 and FIG. 2, the cellular phone includes a main body 102 and a rotary body (top cover) 101. The main body 102 has a hollow shaft 1021 having a hole 1022. A gap 1023 is formed on the hollow shaft 1021. A flexible printed cable (hereinafter FPC) 202 has conducting circuits (not shown), connecting ends 2021, 2022 and a bent portion 2023. The connecting ends 2021, 2022 are connected to the rotary body 101 and the main body 102, respectively. The bent portion 2023 can reduce the tensile stress on the FPC 202 when the rotary body 101 rotates, thus increasing the lifespan of the FPC 202.

Figure 3:
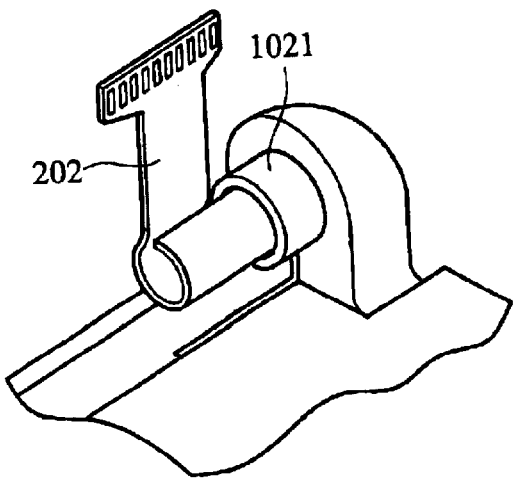
FIG. 3 shows the bent portion of the present flexible printed cable fit into a hollow shaft.

Specifically, the originally flat FPC 202 is bent to a shape as shown in FIG. 2. Then, the connecting end 2022 of the FPC 202 penetrates the hole 1022 and the gap 1023 of the hollow shaft 1021 of the main body 102. The bent portion 2023 fits in the hole 1022, as shown in FIG. 3.

As mentioned above, the originally flat FPC 202 is bent to a shape as shown in FIG. 2. Because the FPC 202 has elasticity, the bent portion 2023 is not easily maintained to fit in the hole 1022. The bent portion 2023 has to be held carefully by hands or clips to fit in the hole 1022. Thus, the reliability is low. In order to overcome the aforementioned problems, the invention provides the following methods to maintain the shape of the bent portion 2023.

The First Method

Figure 4A:
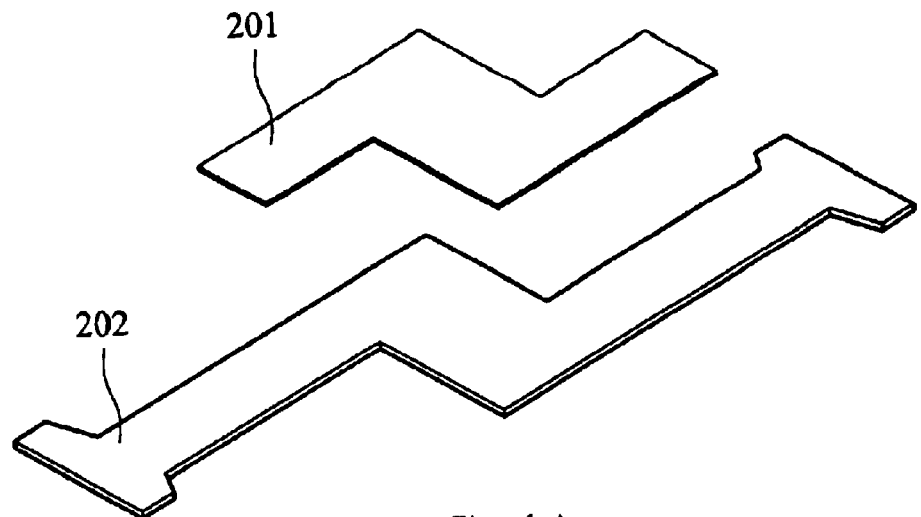
FIG. 4A, FIG. 4B and FIG. 4C show the shaping steps for the present flexible printed cable.

Referring to FIG. 4A, an attachment material 201 is provided. The attachment material 201 and the FPC 202 have a glass transition temperature $T_{ga}$ and a glass transition temperature $T_{gF}$, respectively. The glass transition temperature $T_{ga}$ is lower than the glass transition temperature $T_{gF}$. When the temperature exceeds the glass transition temperature $T_{ga}$, the attachment material 201 becomes malleable. Then, when the temperature lowers, the attachment material 201 hardens in the new shape.

Figure 4B:
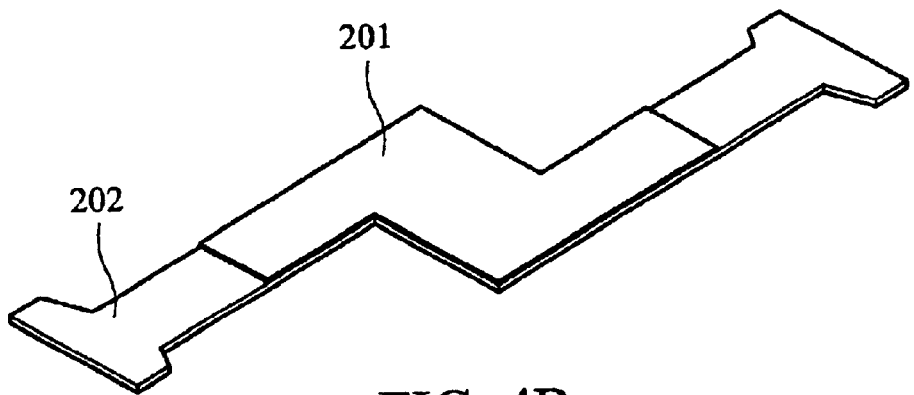

Referring to FIG. 4B, the attachment material 201 is fixed on the FPC 202 by glue, heating press and/or other means.

Figure 4C:
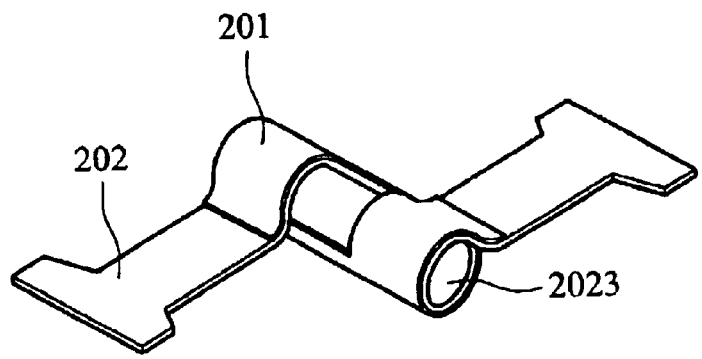

Referring to FIG. 4C, the FPC 202 having the attachment material 201 is bent into the bent portion 2023 by an external force. Then, the FPC 202, in combination with the attachment material 201, is heated to a temperature higher than the glass transition temperature $T_{ga}$ to soften the attachment material 201 (the temperature does not exceed the temperature to damage the FPC 202). The FPC 202, in combination with the attachment material 201, is then cooled to the ambient temperature to harden the attachment material 201. At this time, the attachment material 201 is shaped by the heating and external force. Even though the natural shape of the FPC 202 is not changed, the FPC 202 conforms to the same shape as the bent attachment material 201.

Figure 5:
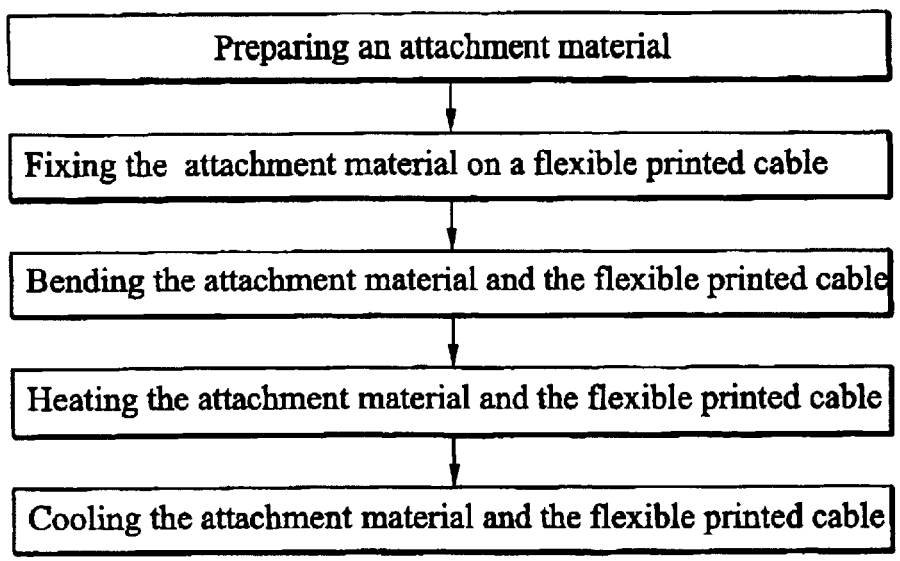
FIG. 5 is a flowchart showing the first method of the invention for shaping an object.

FIG. 5 is a flowchart showing the first method.

The Second Method

Referring to FIG. 4A, an attachment material 201 is provided. The attachment material 201 and the FPC 202 have a glass transition temperature $T_{ga}$ and a glass transition temperature $T_{gF}$, respectively. The glass transition temperature $T_{ga}$ is lower than the glass transition temperature $T_{gF}$. When the temperature reaches the glass transition temperature $T_{ga}$, the attachment material 201 becomes malleable. Then, when the temperature lowers, the attachment material 201 hardens in the new shape.

Referring to FIG. 4B, the attachment material 201 is fixed on the FPC 202 by glue, heating press and/or other means. Then, the FPC 202, in combination with the attachment material 201, is heated to a temperature higher than the glass transition temperature $T_{ga}$ to soften the attachment material 201 (the temperature does not exceed the temperature to damage the FPC 202).

Referring to FIG. 4C, the FPC 202 having the attachment material 201 is bent into the bent portion 2023 by an external force. Then, the FPC 202, in combination with the attachment material 201, is cooled to the ambient temperature to harden the attachment material 201. At this time, the attachment material 201 is shaped by the heating and external force. Even though the original shape of the FPC 202 is not changed, the FPC 202 conforms to the same shape as the bent attachment material 201.

Figure 6:
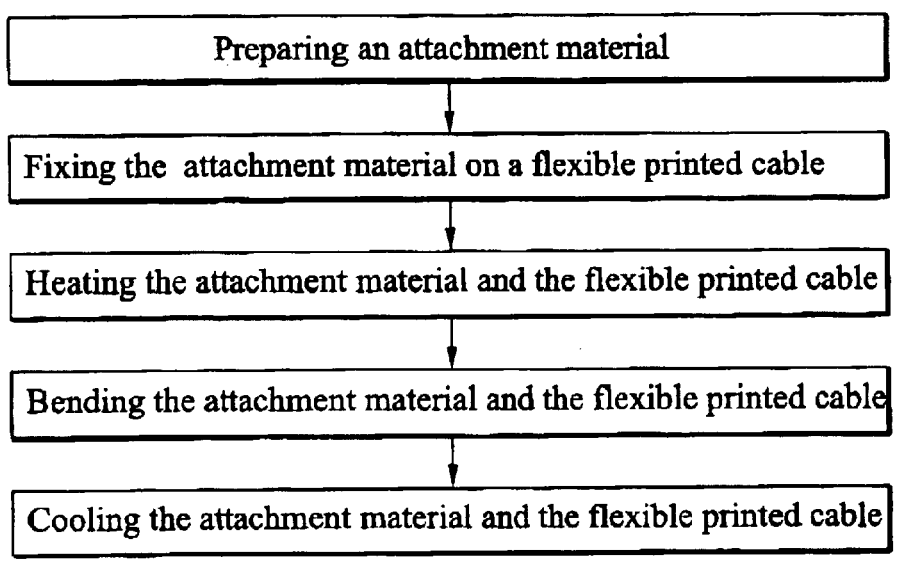
FIG. 6 is a flowchart showing the second method of the invention for shaping an object.

FIG. 6 is a flowchart showing the second method.

In the first method, after the attachment material 201 is fixed on the FPC 202, the FPC 202, in combination with the attachment material 201, is shaped to a bent soft circuit board via bending, heating and cooling. In the second method, after the attachment material 201 is fixed on the FPC 202, the FPC 202, in combination with the attachment material 201, is shaped to a bent soft circuit board via heating, bending and cooling. The steps of bending and heating can be exchanged to achieve the object of the invention.

For example, if the bottom material of the FPC 202 is Polyimide (PI), with a glass transition temperature of about the range of 250° C., the attachment material 201 is made of Polycarbonate (PC), with a glass transition temperature of about the range of 120° C., and the Polycarbonate is fixed on the Polyimide by glue or heating press, a soft circuit board having a predetermined bent shape can be obtained by the aforementioned first or second method.

To summarize, the invention can generate a stable holding force for the FPC by the attachment material rather than by manual manipulation. Thus, the bent portion of the FPC can maintain the bent shape to fit in the pivot-rotating mechanism. The invention has significant benefits especially for the small pivot-rotating mechanism. In addition, the invention is not limited to a cellular phone. Specifically, the invention can be applied in any electronic device required to transmit signals via a pivot-rotating mechanism.

While the invention has been described by way of example and in terms of the preferred embodiment, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for shaping an object, the object having a first glass transition temperature, comprising the steps of:
   preparing an attachment material having a second glass transition temperature lower than the first glass transition temperature of the object;
   fixing the attachment material on the object;
   forming the object into a predetermined shape;
   heating the attachment material until the temperature is higher than the second glass transition temperature; and
   cooling the attachment material and the object until the temperature is lower than the second glass transition temperature.

2. The method for shaping an object as claimed in claim 1, wherein the attachment material is made of Polycarbonate (PC).

3. The method for shaping an object as claimed in claim 1, wherein the object is a flexible printed cable (FPC).

4. The method for shaping an object as claimed in claim 1, wherein, in the step of fixing the attachment material on the object, the attachment material is fixed on the object by heating press.

5. The method for shaping an object as claimed in claim 1, wherein, in the step of forming the object, the object is bent into the predetermined shape by an external force.

6. The method for shaping an object as claimed in claim 1, wherein, in the step of heating the attachment material, the temperature does not exceed the temperature to damage the object.

7. The method for shaping an object as claimed in claim 1, wherein, in the step of cooling the attachment material, the attachment material and the object are cooled to the ambient temperature.

8. The method for shaping an object as claimed in claim 1, wherein the step of forming the object is processed before the step of heating the attachment material.

9. The method for shaping an object as claimed in claim 1, wherein, in the step of forming the object, the object and attachment material are simultaneously formed into the predetermined shape.

* * * * *